United States Patent [19]

Urushima

[11] Patent Number: 5,662,263
[45] Date of Patent: Sep. 2, 1997

[54] SINGLE POINT BONDING METHOD

[75] Inventor: Michitaka Urushima, Tokyo, Japan

[73] Assignee: NEC Corporation, Tokyo, Japan

[21] Appl. No.: 413,907

[22] Filed: Mar. 30, 1995

[30] Foreign Application Priority Data

Mar. 30, 1994 [JP] Japan .................................. 6-061739

[51] Int. Cl.⁶ .................................................. B23K 31/02
[52] U.S. Cl. .......................... 228/102; 228/179.1; 228/6.2
[58] Field of Search .............................. 228/179.1, 102, 228/6.2

[56] References Cited

U.S. PATENT DOCUMENTS 5,269,452  12/1993  Sterczyk ............................ 228/102

FOREIGN PATENT DOCUMENTS

| 59-21055 | 2/1984 | Japan | 228/179.1 |
| 4-024933 | 1/1992 | Japan . | |
| 5-074875 | 3/1993 | Japan . | |
| 5-74875 | 3/1993 | Japan | 228/179.1 |
| 5-183020 | 7/1993 | Japan . | |
| 6-151512 | 5/1994 | Japan . | |

OTHER PUBLICATIONS

T. Nemoto et al., "A Feasibility Study on Single Point Tab For Large Number of Lead Counts and Fine Pitch LSI", IMC 1990 Proceedings, May 30 –Jun. 1, 1990, pp. 202–207.

*Primary Examiner*—P. Austin Bradley
*Assistant Examiner*—Jeffrey T. Knapp
*Attorney, Agent, or Firm*—Young & Thompson

[57] ABSTRACT

There is disclosed a single point TAB technology of sequentially bonding a number of inner leads to corresponding electrodes arranged along each edge of a rectangular principal surface of a semiconductor chip, one lead at a time. Of one array of inner leads arranged along one edge of the principal surface of the semiconductor chip, an inner lead located at a first corner of the one edge is firstly bonded to a corresponding electrode of the semiconductor chip, and thereafter, the inner leads are sequentially bonded to corresponding electrodes of the semiconductor chip in the order starting from an inner lead located at a second corner of the same one edge and reaching an inner lead located at a central portion of the same one edge, and then, the inner leads are sequentially bonded to corresponding electrodes of the semiconductor chip in the order starting from an inner lead next to the inner lead located at the first corner of the same one edge and reaching an inner lead just before the inner lead located at the central portion of the same one edge.

12 Claims, 6 Drawing Sheets

SINGLE POINT BONDING METHOD

BACKGROUND OF THE INVENTION

1. Field of the Invention

The present invention relates to a single point bonding method; and more specifically to a single point bonding method used in particular for a TAB (Tape Automated Bonding) packaging.

2. Description of Related Art

As shown in FIGS. 1A and 1B, a film carrier tape used in the TAB packaging includes an insulative base film 1 formed of for example polyimide. The insulative base film 1 has two arrays of sprocket holes 2 formed at both edges thereof for conveying and positioning, and a plurality of square device holes 3 (only one shown) in which a semiconductor chip 10 is to be located. The base film 1 has on its one surface a number of leads 6 and a number of test pads 7 for electrical selection or sorting, which are formed for example by adhering a metal foil such as a copper foil on the surface of the base film 1 and etching the metal foil into a desired pattern by means of a photolithography. Each of the leads 6 includes an inner lead 6A projecting into the device hole 3 and an outer lead 6B connected to one test pad 7. The leads 6 are plated with a metal such as a gold, tin, or solder.

Directly under the outer leads 6B, the base film 1 has four rectangular outer lead holes 4 each formed in parallel to a corresponding one of four edges of the square device hole 3 as shown in the drawing. A suspender 5 between the outer lead holes 4 and the device hole 3 holds the leads 6 and is coupled to the body of the base film 1 at four corners.

In order to bond the leads 6 of the film carrier tape to the semiconductor chip 10, a bump 8, which is a metal projection, is previously on each of the electrodes of the semiconductor chip 10, and is positioned directly under a corresponding inner lead 6A to be bonded to the bump. Then a bonding tool (not shown) is activated from an upper position so as to bond the inner lead 6A to the bump 8. This connection manner is called an inner lead bonding (ILB) process.

The semiconductor chip 10 has a square main surface, on which a number of bump 8 are provided along each of edges of the square main surface. However, there may be bumpless electrodes having no projection. The inner leads 6A positioned to oppose the corresponding bumps 8 are fixed on the suspender 5 in units of each edge of the square device hole, and the outer leads 6B are fixed to the body of the base film 1. In a process after the inner lead bonding, the test pads 7 and the base film 1 are removed. In fact, the bumps are greatly more than the number of the shown bumps, and in some cases, some of the leads 6 are previously omitted.

Generally, the ILB process is divided into two kinds: a gang bonding for simultaneously bonding all the inner leads 6A to the bumps by a bonding tool; and a single point bonding for bonding the inner leads 6A to the bump 8, one lead at a time. The former gang bonding becomes difficult to maintain the parallelism between the bonding tool and the semiconductor chip 10, if the size of the semiconductor chip 10 becomes large and the number of the leads 6 also increases. In addition, for adjusting the parallelism, a lengthy setting operation is required at each time the size of the semiconductor chip 10 changes. Therefore, the gang bonding is poor in regard to large pin-numbers which is required in a few-of-a-kind production. The latter single point bonding does not require the fine adjustment required in the former gang bonding, since the inner leads are certainly bonded by the bonding tool, one at a time. Therefore, with a size-increasing and pin-number-increasing inclination of the semiconductor chips, inner lead bonding machines adopting the single point bonding are increasing in number.

When the ILB process is performed using the single point bonding, since the inner leads 6A are bonded one by one, the bonding time becomes long for example if the pin number reaches 200 or more. Because of this, the base film 1 thermally expands due to a heat applied to the bonding tool at the time of the bonding, so that as the bonding of the inner leads 6A advances, a positional shift or deviation gradually occurs. As a result, it becomes difficult or impossible to properly push the inner leads 6A by the boning tool. Therefore, a defective bonding occurs due to the positional shift or deviation, and although the bonding is obtained, the bonding strength becomes insufficient.

According to the technique disclosed in Japanese Patent Application Laid-open Publication JP-A-5-074875 to cope with the above mentioned problem, as shown in FIG. 2A, among a number of inner leads 6A (parts omitted in the drawing) in the device hole 3 along each edge of the square principal surface of the semiconductor chip (not shown), firstly, inner leads 61 positioned at a central portion of one edge are bonded, and then, inner leads 62 positioned at a central potion of the edge opposing to the edge of the inner leads 61 are bonded. Thereafter, inner leans 63 are bonded, and then, inner leads 64 are bonded. This patent application describes that, with this procedure, the thermal expansion of the base film can be dispersed, with the result that the lead positional deviation can be relaxed. The disclosure of Japanese Patent Application Laid-open Publication JP-A-5-074875 is incorporated by reference in its entirety into the present application.

Another prior art, "IMC 1990 Proceedings, Tokyo, May 30–Jun. 1, 1990", Pages 202–207, mentions that, as shown in FIG. 2B, of a number of inner leads 6A (parts omitted in the drawing) along each edge of the square device hole, firstly, an inner lead(s) 71 positioned at a corner is bonded, and then, inner leads 72, 73, 74, 75: 76, 77 and 78 each positioned at one corner are bonded in the named order, and with this procedure, the positional deviation can be prevented. The disclosure of "IMC 1990 Proceedings, Tokyo, May 30–Jun. 1, 1990", Pages 202–207 is also incorporated by reference in its entirety into the present application.

However, neither of the conventional bonding procedures shown in FIGS. 2A and 2B can completely solve the generation of the positional deviation, because sufficient attention is not paid to a relation between the bonding time and the thermal expansion and because deformation of the base film is considered only in a lateral direction (along an edge).

For example, assuming that the bonding is sequentially performed, one at a time, from a left-hand first corner to a right-hand second corner, a conduction heat of the heated semiconductor chip and a radiation heat from the bonding tool are transferred through the inner leads to the base film, so that the base film thermally expands. Therefore, if some degree of bonding time elapses, unbonded inner leads gradually cause the positional deviation so that the inner leads eventually fail to be accurately positioned on the electrodes of the semiconductor chip. In this condition, if the bonding tool is abutted onto the inner lead, a defective electrical and mechanical connection occurs.

In particular, in the case that the central inner leads are first bonded as shown in FIG. 2A, when inner leads at one side of the bonded central inner leads are being bonded one by one, inner leads at the other side of the bonded central inner leads cause the positional deviation due to heat transmitted from the bonded central inner leads.

In the conventional example shown in FIG. 2B in which the bonding of the inner leads is started from both corners (first and second corners) in order to prevent a lateral positional deviation, since the base film expands similarly, in most cases the base film deforms upward into a convex form (in a direction of increasing the distance between the semiconductor chip and the inner leads). As a result, the distance from the inner lead to the corresponding pad electrode becomes long, so that the length of the inner leads becomes insufficient, with the result that a defective bonding may occur. In addition, since the base film is lifted to depict a circular arc, the inner leads at both sides of the top of the circular arc are inclined to the pad electrode surface of the semiconductor chip. If the bonding is performed in this condition, the inner leads cannot be certainly closely bonded on the pad electrode, so that the inner leads slide, resulting in a defective bonding.

The height of the top of the circular arc from the level of the corner portion is on the order of 30 μm to 70 μm (in the case that the thickness of the base film is 125 μm). Accordingly, if the bonding is sequentially performed in only one direction, the inner leads eventually fail to be accurately positioned on the electrode.

SUMMARY OF THE INVENTION

Accordingly, it is an object of the present invention to provide a single point bonding method which has overcome the above mentioned defect of the conventional one.

Another object of the present invention is to provide a single point bonding method capable of minimizing a positional deviation between an inner lead and a corresponding electrode on a semiconductor chip, and therefore, minimizing a defective electrical and mechanical connection caused by the positional deviation.

Still another object of the present invention is to provide a single point bonding method capable of minimizing a thermal displacement of a base film on which the inner leads are arranged.

A further object of the present invention is to provide a single point bonding method having a unique bonding order capable of performing a satisfactory bonding even if the inner lead becomes away from the electrode because of a thermal expansion of the base film.

A still further object of the present invention is to provide a single point bonding method having an optimized bonding order so as to comply with a size-increasing and pin-number-increasing of the semiconductor chips, so that a high production yield can be obtained.

The above and other objects of the present invention are achieved in accordance with the present invention by a single point bonding method of sequentially bonding a number of inner leads to corresponding electrodes arranged along each edge of a rectangular principal surface of a semiconductor chip, one lead at a time, by using a film carrier tape which has arrays of inner leads arranged on a base film and which is positioned so as to cause each of the inner leads to oppose a corresponding electrode of the semiconductor chip, characterized in that, of one array of inner leads arranged along one edge of the principal surface of the semiconductor chip, an inner lead located at a first corner of the one edge is firstly bonded to a corresponding electrode of the semiconductor chip, and thereafter, the inner leads are sequentially bonded to corresponding electrodes of the semiconductor chip in the order starting from an inner lead located at a second corner of the same one edge and reaching an inner lead located at a central portion of the same one edge, and then, the inner leads are sequentially bonded to corresponding electrodes of the semiconductor chip in the order starting from an inner lead next to be inner lead located at the first corner of the same one edge and reaching an inner lead just before the inner lead located at the central portion of the same one edge.

According to another aspect of the present invention, there is provided a single point bonding method of sequentially bonding a number of inner leads to corresponding electrodes arranged along each edge of a rectangular principal surface of a semiconductor chip, one lead at a time, by using a film carrier tape which has arrays of inner leads arranged on a base film and which is positioned so as to cause each of the inner leads to oppose a corresponding electrode of the semiconductor chip, characterized in that, of one array of inner leads arranged along one edge of the principal surface of the semiconductor chip, an inner lead located at a first corner of the one edge is firstly bonded to a corresponding electrode of the semiconductor chip, and then, an inner lead located at a central portion of the same one edge is secondly bonded to a corresponding electrode of the semiconductor chip, and thereafter, the inner leads are sequentially bonded to corresponding electrodes of the semiconductor chip in the order starting from an inner lead located at a second corner of the same one edge and reaching to an inner lead just before the inner lead located at the central potion of the same one edge, and then, the inner leads are sequentially bonded to corresponding electrodes of the semiconductor chip in the order starting from an inner lead next to the inner lead located at the first corner of the same one edge and reaching an inner lead just before the inner lead located at the central portion of the same one edge.

According to still another aspect of the present invention, there is provided a single point bonding method of sequentially bonding a number of inner leads to corresponding electrodes arranged along each edge of a rectangular principal surface of a semiconductor chip, one lead at a time, by using a film carrier tape which has arrays of inner leads arranged on a base film and which is positioned so as to cause each of the inner leads to oppose a corresponding electrode of the semiconductor chip, characterized in that, of one array of inner leads arranged along one edge of the principal surface of the semiconductor chip, an inner lead located at a first corner of the one edge is firstly bonded to a corresponding electrode of the semiconductor chip, and then, a plurality of selected intermediate inner leads are sequentially bonded to corresponding electrodes of the semiconductor chip towards an inner lead located at a second corner of the same one edge, and thereafter the remaining unbonded inner leads are sequentially bonded to corresponding electrodes of the semiconductor chip in the order starting from an inner lead next to the inner lead located at the second corner of the same one edge towards an inner lead located at a central portion of the same one edge, and then, in the order from an inner lead next to the inner lead located at the first corner of the same one edge towards the inner lead located at the central portion of the same one edge.

The above and other objects, features and advantages of the present invention will be apparent from the following description of preferred embodiments of the invention with reference to the accompanying drawings.

DESCRIPTION OF THE PREFERRED EMBODIMENTS

Figures 1A, 1B:
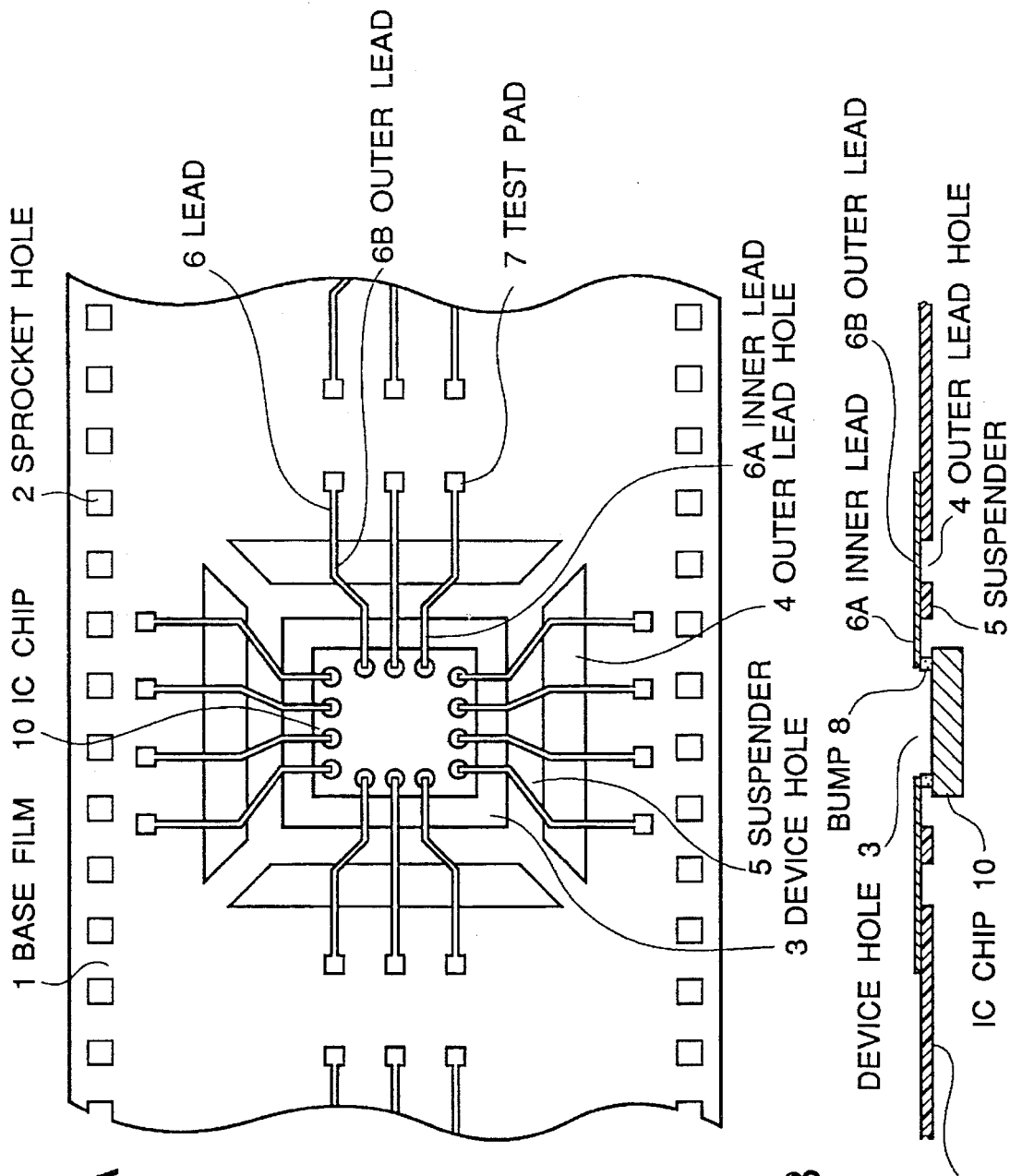
FIGS. 1A and 1B are a diagrammatic partial plan view and a diagrammatic partial sectional view of a TAB film carrier tape and one semiconductor chip bonded thereto.
Figure 2A:
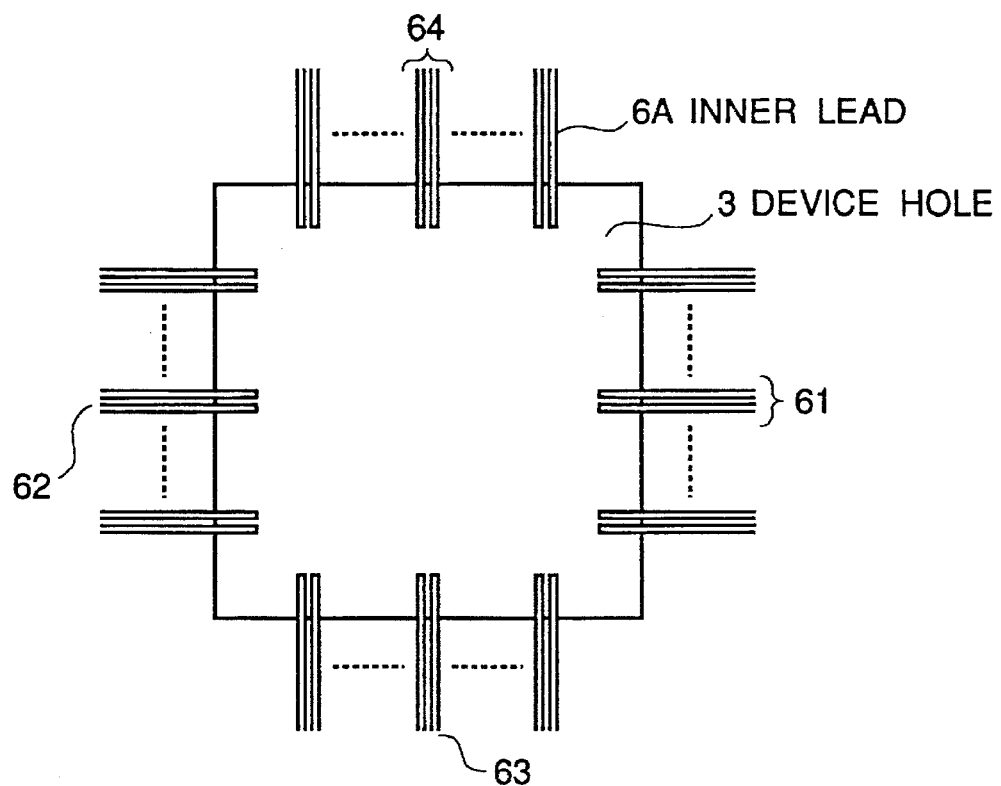
FIGS. 2A and 2B illustrate two conventional single point bonding procedures for the inner lead bonding.
Figure 2B:
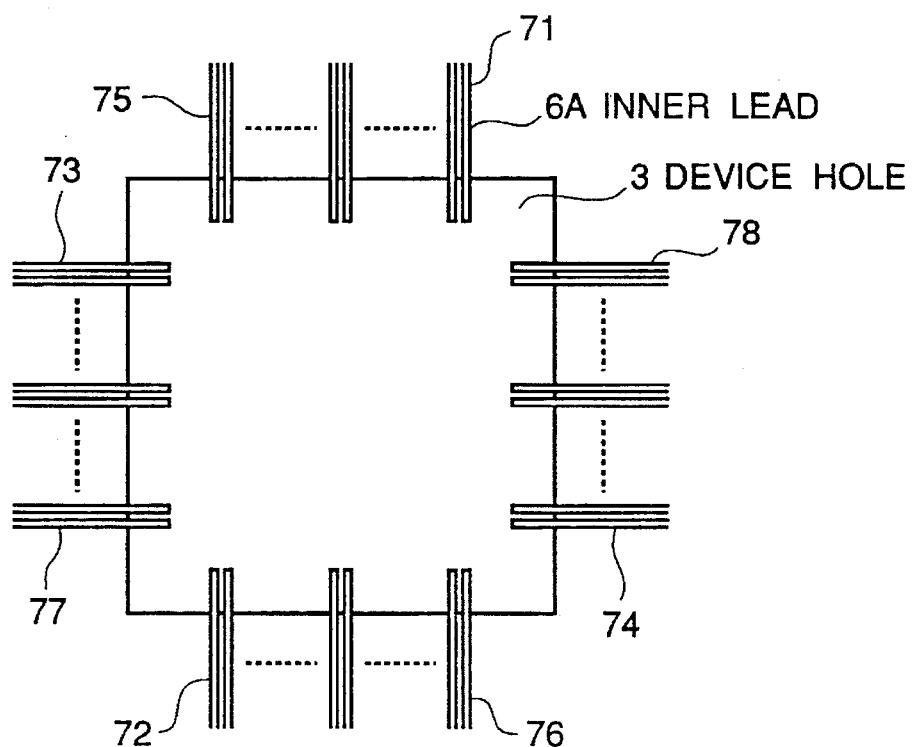
Figure 3:
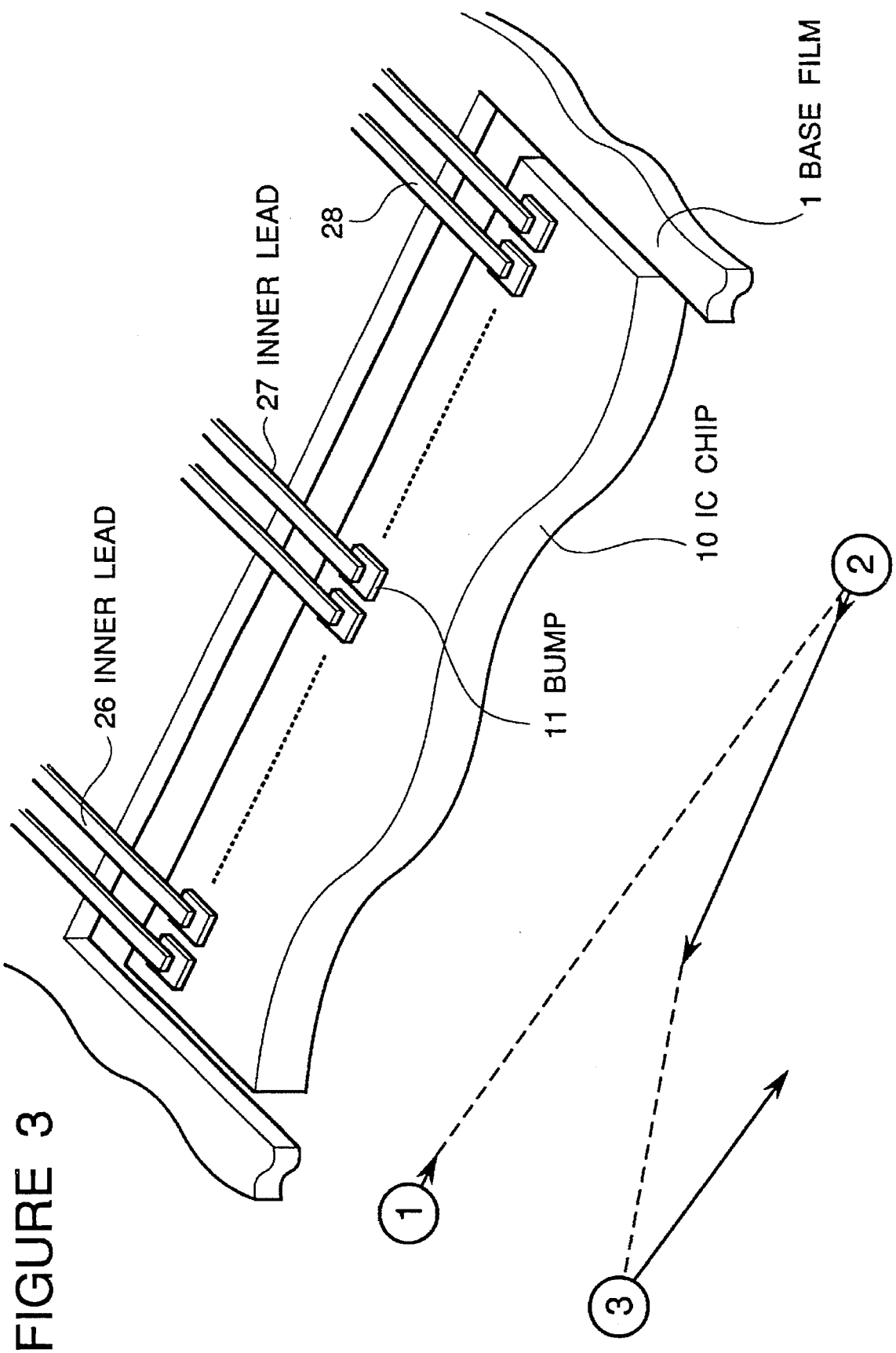
FIG. 3 is a diagrammatic partial perspective view illustrating a first embodiment of the single point bonding procedure in accordance with the present invention.

Referring to FIG. 3, there is shown a diagrammatic partial perspective view of a base film and a semiconductor chip, illustrating a first embodiment of the single point bonding procedure in accordance with the present invention. FIG. 3 shows only a portion along one edge of (a principal surface of) a square semiconductor chip 10 and a portion of a base film 1 of a TAB tape having some number of inner leads corresponding to the one edge of (a principal surface of) the semiconductor chip 10. Since the inner lead bonding for the remaining three edges of the semiconductor chip 10 is the same as that performed for the shown one edge of the semiconductor chip 10, explanation will be made only on the inner lead bonding performed for the shown one edge of the semiconductor chip 10.

In this embodiment, a number of bumps 11 are arrayed along the one edge of the semiconductor chip 10, and there is prepared a base film 1 on which a number of inner leads 26, 27 and 28 are arrayed to correspond to the bumps 10, respectively.

For simplification of the drawing, in FIG. 3 there are not shown bumps and inner leads other than the inner leads 26 positioned at a first corner (one end of the one edge), the inner leads 27 at a central portion of the one edge, and the inner leads 28 positioned at a second corner (the other end of the one edge), and bumps to be bonded to the inner leads 26, 27 and 28. Therefore, it should be understood that the not-shown bumps and inner leads are arranged similarly to the inner leads 26, 27 and 28 and the corresponding bumps.

Circled numbers ①, ② and ③ shown in a lower portion of FIG. 3 indicate the order of the bonding operation. The step ① indicates the bonding of the inner leads 26 at the first corner, and the step ② indicates the bonding of the inner leads 28 at the second corner. The step ③ indicates the bonding of unbonded inner leads next to the inner leads 26 at the first corner.

Before the bonding, a distance between the principal surface of the semiconductor chip 10 and an opposing surface of the inner leads is set to be in be range of 0.05 mm to 0.1 mm. In addition, the semiconductor chip 10 is previously heated to a temperature of about 250° C. by a heating means (not shown). On the other hand, a bonding tool may be heated to a temperature higher than that of the semiconductor chip 10, but may be used in an ordinary temperature without heating. In the shown embodiment, the plan size of the semiconductor chip 10 is 8 mm square or less.

After the above mentioned setting operation, two or three inner leads 26 at the first corner are bonded to corresponding bumps 11, one lead at a time, in the step ①. Then, the bonding tool is brought into a not-bonding condition and is quickly moved to an inner lead next to the inner leads 26 at the first corner. Furthermore, the bonding tool maintained in the not-bonding condition is quickly moved to the inner lead 28 at the second corner. In the next step ②, the inner leads are sequentially bonded to corresponding bumps 11, one lead at a time, in the order starting from the inner lead 28 at the second corner to the inner lead 27 at the central portion of the one edge. Thereafter, the bonding tool is maintained in the not-bonding condition and is quickly moved to the inner lead 26 at the first corner. In the step ③, the inner leads are sequentially bonded to corresponding bumps 11, one lead at a time, in the order starting from an inner lead next to the inner leads 26 at the first corner toward the inner lead 27 at the central portion of the one edge.

For example, if the total number of the inner leads arranged on the one edge is 100, the inner lead 27 at the central portion of the one edge is a fiftieth lead counted from a corner.

In the above mentioned bonding procedure, after the inner leads 26 at the first corner are bonded but before the base film thermally expands substantially, the inner leads 28 at the second corner are bonded. Therefore, a substantial positional deviation does not occur. Thereafter, since the inner leads are sequentially bonded, one lead at a time, in the order starting from the inner leads 28 having only an extremely small positional deviation or no substantial positional deviation, towards the central portion of the one edge in a left direction in the drawing, a further positional deviation does not occur substantially. In addition, since this inner lead bonding is stopped at the inner leads 27 at the central portion, even if the positional deviation occurs, the positional deviation is not accumulated. Next, since the inner leads are sequentially bonded, one lead at a time, from a left end in the right direction in the drawing, the bonding is completed as if the right positional deviation and the left positional deviation were mutually cancelled.

As mentioned above, the inner leads are bonded in such a manner that the displacement of the base film 1 caused by the thermal expansion is relaxed and is mutually cancelled. As a result, the positional deviation is minimized, and a defective electrical and mechanical connection does not occur.

Here, the central inner lead is determined to be an inner lead nearest to a maximum displacement position of the base film which actually occurs or is expected as a matter of course when the first and second corner inner leads 26 and 28 are bonded.

For example, if a plurality of inner leads are selected as the central inner lead, the inner leads are selected in such a manner that an inner lead nearest to the above mentioned maximum displacement position is selected as a center lead, and the same number of inner leads are distributed at each side of the center lead, if the number of the selected central inner leads are odd. If the number of the selected central inner leads are even, the number of inner leads distributed at one side of the center lead is made larger than the number of inner leads distributed at the other side of the center lead by one.

If the inner leads at the first and second corners are bonded, the base film 1 thermally expands by radiation heat at the time of the thermal pressure bonding, so that the base film 1 bends in the form of an arc having an upwardly directed convex. The top of this arc is the maximum displacement position (10 μm or more height in the first embodiment). An inner lead nearest to the top of the arc is the inner lead 27 at the central portion of the one edge. If the central inner lead includes a plurality of inner leads, they are grouped as mentioned above.

Therefore, the central inner lead can in some case be an inner lead separated from the inner leads 26 and 28 at the first and second corners by the same distance. In another case, the central inner lead can be an inner lead separated from the inner leads 26 and 28 at the first and second corners by the same number of inner leads counted from the inner leads 26 and 28, respectively. If some of the inner leads are omitted, the central inner lead can be composed of an inner lead at the maximum displacement position of the base film or a plurality of inner leads including as a center inner lead the inner lead at the maximum displacement position of the base film.

The above explanation in connection with the same distance or the same number of inner leads can be applied to the case in which the total number of inner leads arranged in one edge is odd. In the case having an even number of inner leads arranged in one edge, the central inner lead can be one or the other of a pair of inner leads separated from the first and second corner inner leads by the same distance or by the number of inner leads. The above mentioned definition of the "inner lead at a central portion" of the one edge can be equally applied to a second and succeeding embodiments.

The above mentioned embodiment has been explained with the inner lead at the first corner being at a left hand in the drawing and the inner lead at the second corner being at a right hand in the drawing. This relation can be inverted. In the above mentioned embodiment, the bumps 11 have been provided, but the invention can be applied to bumpless electrodes. Furthermore, each of the inner leads 26, 27 and 28 at the first and second corner and at the central portion has been shown to be composed of two inner leads, but it can be composed of only one inner lead, or three or four or moire inner leads. In particular, the number of the inner leads at the first corner is preferred to be not larger than 25% of the total number of the inner leads located in one edge. In all of the steps ①, ② and ③, the bonding order of the inner leads is directed towards the central inner lead. This is preferable.

Figure 4:
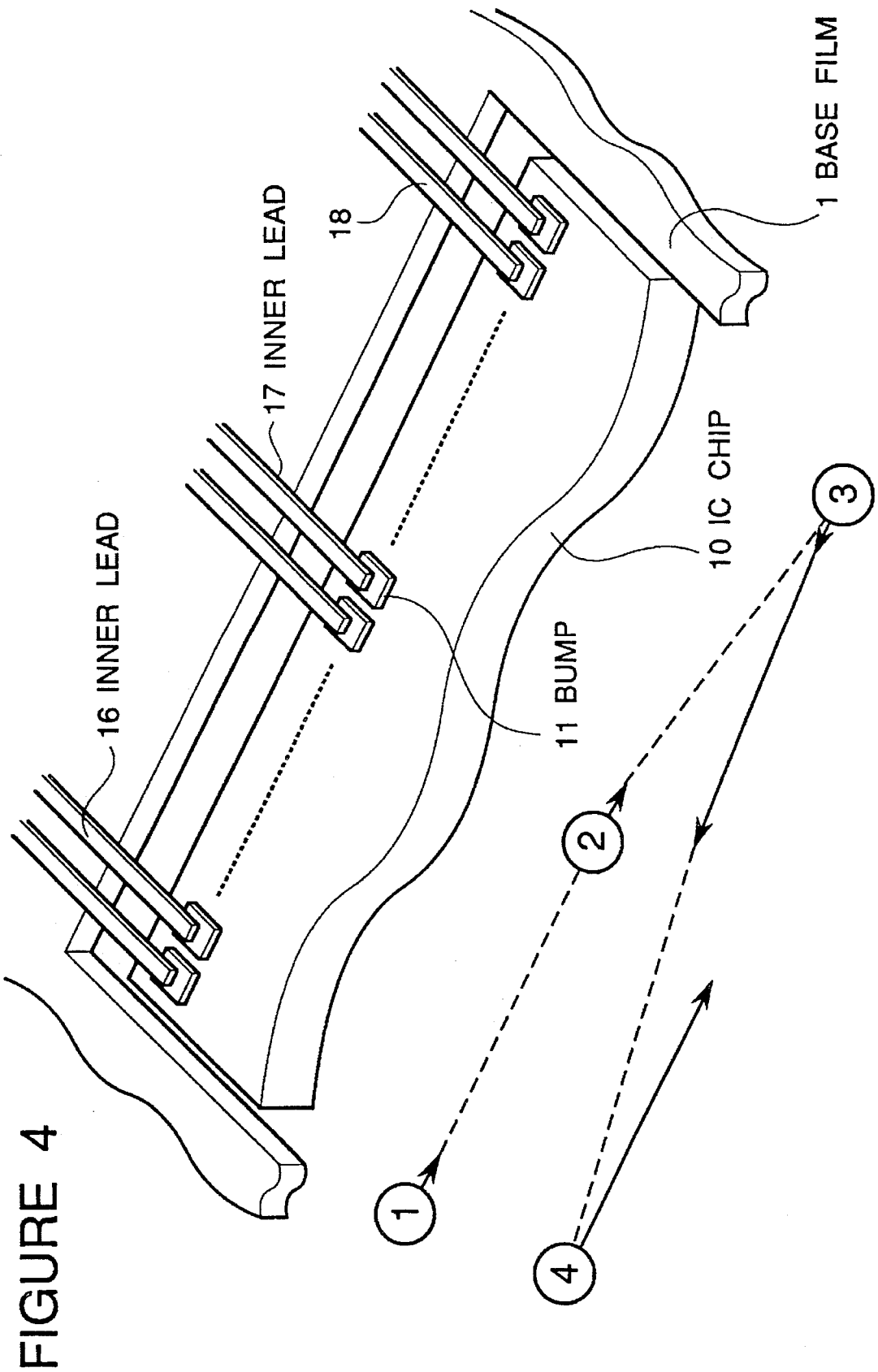
FIG. 4 is a diagrammatic partial perspective view illustrating a second embodiment of the single point bonding procedure in accordance with the present invention.

Referring to FIG. 4, there is shown a diagrammatic partial perspective view illustrating a second embodiment of the single point bonding procedure in accordance with the present invention. In FIG. 4, since the second embodiment is in common to the first embodiment excluding the bonding order different from that of the first embodiment, explanation of the common feature will be omitted.

In the step ①, two or three inner leads 16 at the first corner are bonded to corresponding bumps 11, one lead at a time. In the next step ②, two or three inner leads 17 at a central portion are bonded to corresponding bumps 11, one lead at a time. Thereafter, in the step ③, the inner leads are sequentially bonded to corresponding bumps 11, one lead at a time, in the order starting from inner leads 18 at a second corner towards the inner lead 17 at the central portion of the one edge. Furthermore, in the step ④, the inner leads are sequentially bonded to corresponding bumps 11, one lead at a time, in the order starting from an inner lead next to the inner leads 16 at the first corner toward the inner lead 17 at the central portion of the one edge.

This second embodiment can be applied to a semiconductor chip having a plan size which is larger than that used in the first embodiment, for example, of 10 mm square to 15 mm square. Therefore, since the total number of the inner leads arranged in each one edge is larger than that of the first embodiment, it is preferred to bond the inner leads 17 at the central portion of the one edge in the step ②, so that the inner leads 17 are prevented from rising apart from the electrodes of the semiconductor chip.

The bonding of the inner leads 16 and 17 at the first corner and at the central portion is made to prevent the base film 1 from being displaced due to the thermal expansion of the base film 1 in the process of the step ③. Therefore, the number of the inner leads 16 and 17 to be bonded is preferred to be as small as possible. This is further preferable from another viewpoint for minimizing the time of leaving the inner leads 16 and 17.

If the inner leads are not distributed at equal intervals or pitches, the inner lead at the central portion can be determined to be an inner lead positioned at or nearest to a half of the distance between the inner leads 16 and 18.

Figure 5:
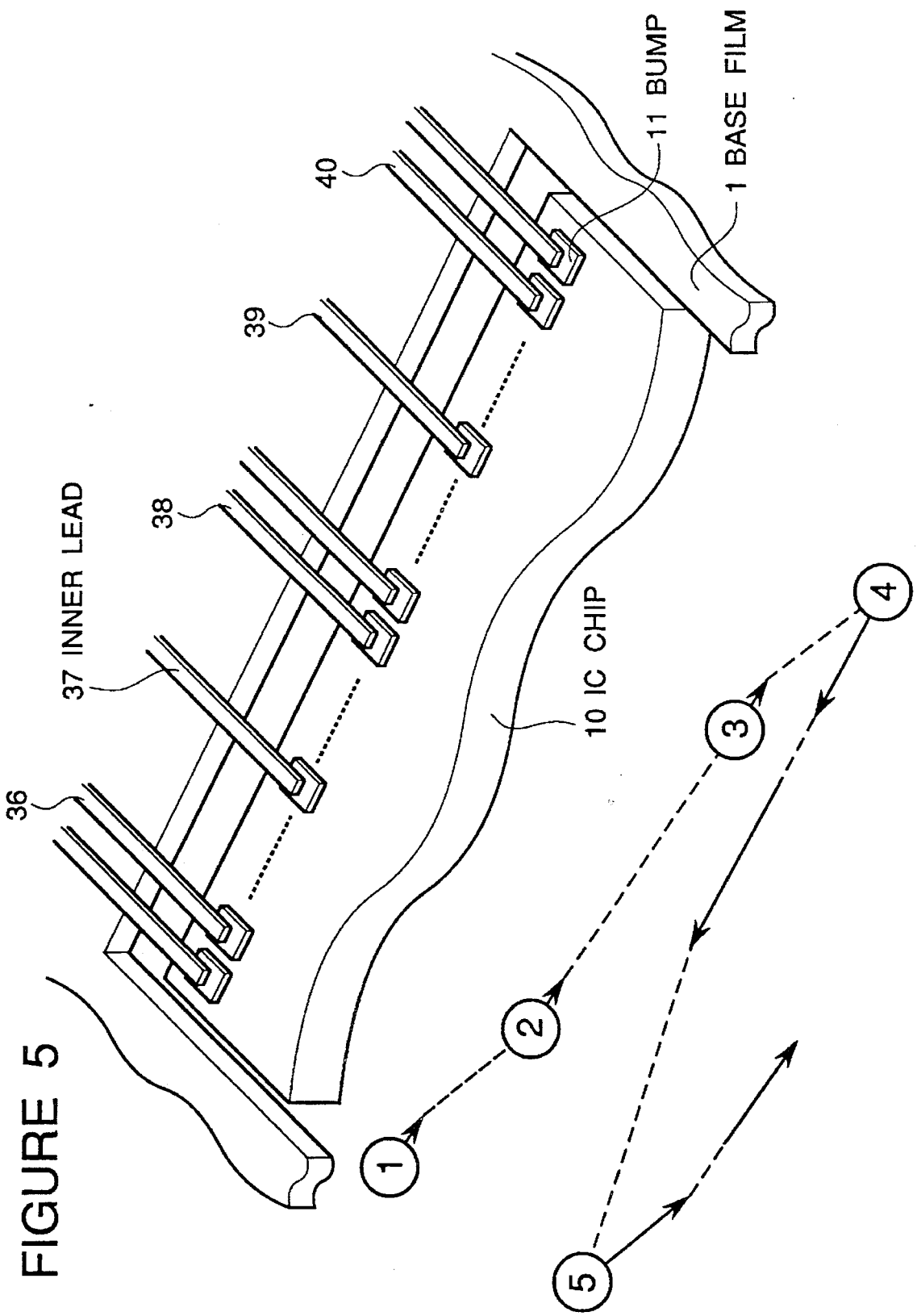
FIG. 5 is a diagrammatic partial perspective view illustrating a third embodiment of the single point bonding procedure in accordance with the present invention.

Referring to FIG. 5, there is shown a diagrammatic partial perspective view illustrating a third embodiment of the single point bonding procedure in accordance with the present invention. In FIG. 5, since the third embodiment is in common to the first embodiment excluding the bonding order and the chip size different from that of the second embodiment, explanation of the common feature will be omitted.

In the step ①, inner leads 36 at the first corner are bonded to corresponding bumps 11, one lead at a time. In the next step ②, an inner lead(s) 37 at a first intermediate portion is bonded to a corresponding bump 11. In the step ③, an inner lead(s) 39 at a second intermediate portion is bonded to a corresponding bump 11. In the step ④, unbonded inner leads are sequentially bonded to corresponding bumps 11, one lead at a time, in the order starting from inner leads 40 at a second corner and reaching inner lead 38 at a central portion of the one edge. Furthermore, in the step ⑤, unbonded inner leads are sequentially bonded to corresponding bumps 11, one lead at a time, in the order starting from an inner lead next to the inner leads 36 at the first corner toward the inner lead 38 at the central portion of the one edge. Thus, all of the bondings in one edge are completed.

The third embodiment is suitable in the case that the semiconductor chip 10 has a plan size larger than that used in the second embodiment. Therefore, since the total number of the inner leads arranged in each one edge is larger than that of the second embodiment, the inner leads 37 and 39 at the two intermediate portions of the one edge are previously bonded. However, it is possible to bond the inner leads at three or more intermediate portions of the one edge, dependently upon the chip size.

Figure 6:
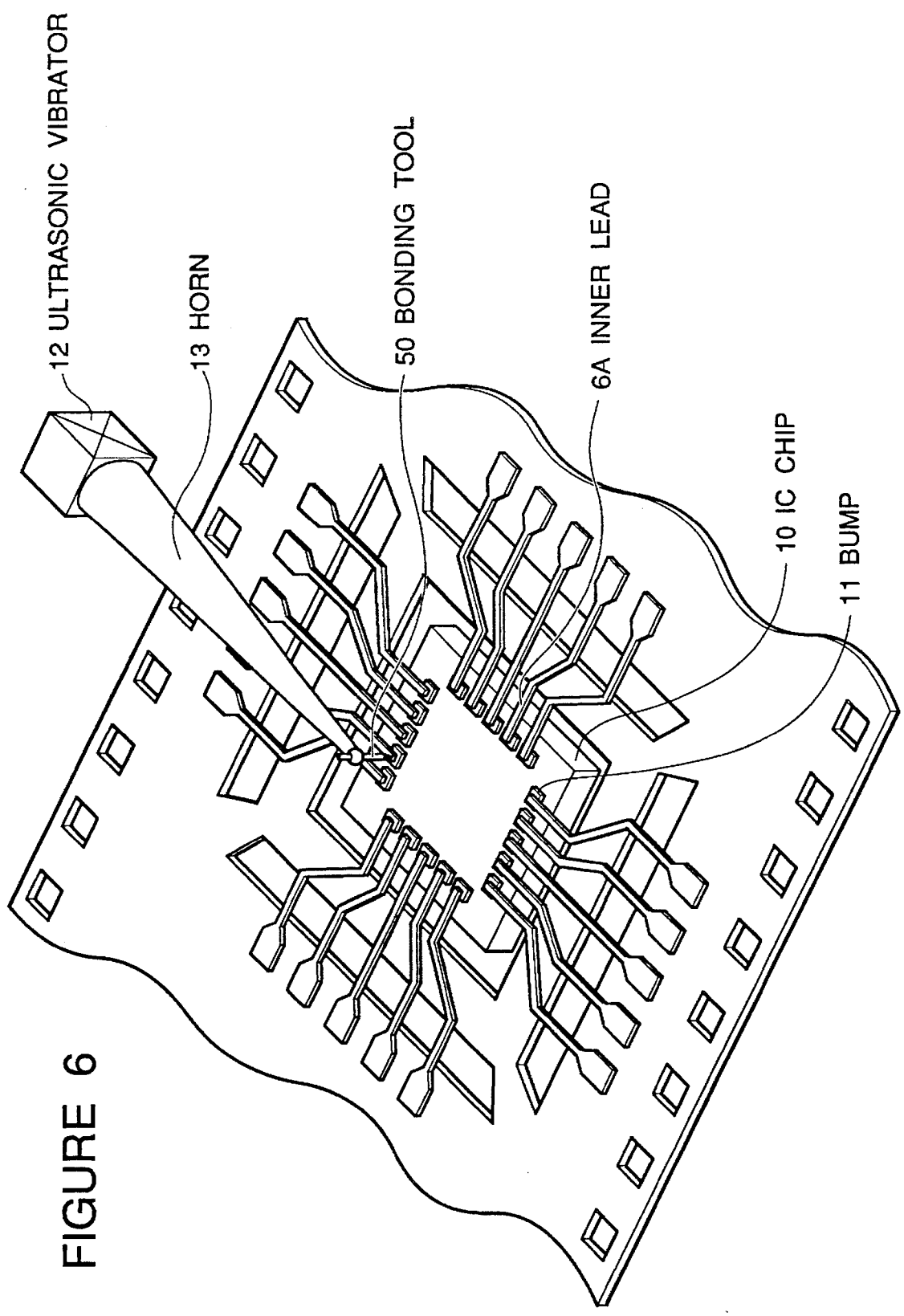
FIG. 6 is a diagrammatic perspective view illustrating an application example of the single point bonding procedure in accordance with the present invention.

In the above mentioned embodiments, the inner lead bonding in only one edge has been explained. Now, the bonding order of four edges will be examined. Examining a bonding tool 50 mounted on a tip end of a horn 13 having a ultrasonic vibrator 12 provided at a base end thereof as shown in FIG. 6, inner leads on an edge crossed over by the horn 13 and inner leads on an opposite edge are bonded later, but inner leads at left and right edges are preferably firstly bonded. This bonding order is applied in the case that the ultrasonic bonding is utilized in combination with a thermal bonding. Since the positional deviation is enlarged in the direction of the vibration generated by the ultrasonic vibrator 13, it is preferred to firstly bond an array of inner leads extending in parallel to the vibration direction of the ultrasonic vibrator 13. This is particularly advantageous in the case that the positioning precision of the leads in the TAB tape before the bonding is substantially the same in all the four edges, since the bonding order of the edges is preferably determined to firstly select an edge in which the positioning precision of the leads in the TAB tape before the bonding is worst.

As mentioned above, the inner lead bonding in accordance with the present invention can achieve the inner lead bonding in a condition having no substantial positional deviation between the inner leads and corresponding electrodes of the semiconductor chip, and therefore, an excellent electrical and mechanical bonding can be obtained. Accordingly, the inner lead bonding in accordance with the present invention can comply with a size-increasing and pin-number-increasing of the semiconductor chips, so that a high production yield can be obtained.

The invention has thus been shown and described with reference to the specific embodiments. However, it should be noted that the present invention is in no way limited to the details of the illustrated structures but changes and modifications may be made within the scope of the appended claims.

I claim:

1. A single point bonding method of sequentially bonding a number of inner leads to corresponding electrodes arranged along each edge of a rectangular principal surface of a semiconductor chip, one lead at a time, by using a film carrier tape which has arrays of inner leads arranged on a base film and which is positioned so as to cause each of the inner leads to oppose a corresponding electrode of the semiconductor chip, comprising the steps of:
   a) bonding an unbonded inner lead, of one of said arrays arranged along a side of the principal surface of the semiconductor chip located at a first corner of the one edge, to a corresponding electrode of the semiconductor chip;
   b) bonding an unbonded inner lead of said one of said arrays located at a second corner of said one edge to a corresponding electrode of the semiconductor chip;
   c) bonding an unbonded inner lead of said one of said arrays located next to the bonded inner lead at the first corner of said one edge;
   d) bonding an unbonded inner lead of said one of said arrays located next to the bonded inner lead at the second corner of said one edge; and
   e) sequentially repeating said step c), progressing from inner leads at the first corner toward inner leads at a central portion of said one edge, and said step d), progressing from inner leads at the second corner toward inner leads immediately adjacent to said inner leads at said central portion of said one edge, until all of said number of inner leads are bonded to corresponding electrodes.

2. A single point bonding method claimed in claim 1 wherein the inner lead located at the central portion of the same one edge is a center inner lead nearest to a maximum displacement position of the base film occurring when the inner lead at the first corner and the inner lead at the second corner are bonded to the respective corresponding electrodes, or a plurality of adjacent inner leads including said center inner lead.

3. A single point bonding method claimed in claim 1 wherein a plurality of inner leads at the first corner are bonded to the respective corresponding electrodes, one at a time, in the order towards said inner lead located at said central portion of the same one edge.

4. A single point bonding method claimed in claim 3 wherein the number of inner leads at the first corner bonded to the respective corresponding electrodes is not larger than 25% of the total number the inner leads arranged in the same one edge.

5. A single point bonding method of sequentially bonding a number of inner leads to corresponding electrodes arranged along each one of four edges of a rectangular principal surface of a semiconductor chip, one lead at a time, by using a film carrier tape having arrays of inner leads arranged on a base film and positioned to cause each of the inner leads to oppose a corresponding electrode of the semiconductor chip, comprising the steps of:
   a) bonding an unbonded inner lead, of one of said arrays arranged along a side of the principal surface of the semiconductor chip located at a first corner of the one edge, to a corresponding electrode of the semiconductor chip;
   b) bonding an unbonded inner lead of said one of said arrays located at a central portion of said one edge to a corresponding electrode of the semiconductor chip;
   c) bonding an unbonded inner lead of said one of said arrays located at a second corner of said one edge to a corresponding electrode of the semiconductor chip;
   d) bonding an unbonded inner lead of said one of said arrays located next to the bonded inner lead at the first corner of said one edge;
   e) bonding an unbonded inner lead of said one of said arrays located next to the bonding inner lead at the second corner of said one edge; and
   f) sequentially repeating said step d), progressing from inner leads at the first corner toward inner leads immediately adjacent to said inner lead at said central portion of said one edge, and said step e), progressing from inner leads at the second corner toward inner leads immediately adjacent to the inner lead located at the central portion of said one edge, until all of said number of inner leads are bonded to corresponding electrodes.

6. A single point bonding method claimed in claim 5 wherein the inner lead located at the central portion of the same one edge is a center inner lead nearest to a maximum displacement position of the base film occurring when the inner lead at the first corner and the inner lead at the second corner are bonded to the respective corresponding electrodes, or a plurality of adjacent inner leads including said center inner lead.

7. A single point bonding method claimed in claim 5 wherein the number of inner leads at the central portion bonded to the respective corresponding electrodes is not larger than 25% of the total number of the inner leads arranged in the same one edge.

8. A single point bonding method claimed in claim 5 wherein a plurality of inner leads at the first corner are bonded to the respective corresponding electrodes, one at a time, in the order towards said inner lead located at said central portion of the same one edge.

9. A single point bonding method claimed in claim 8 wherein the number of inner leads at the first corner bonded to the respective corresponding electrodes is not larger than 25% of the total number of the inner leads arranged in the same one edge.

10. A single point bonding method of sequentially bonding a number of inner leads to corresponding electrodes arranged along each one of four edges of a rectangular principal surface of a semiconductor chip, one lead at a time, by using a film carrier tape having arrays of inner leads arranged on a base film and positioned to cause each of the inner leads to oppose a corresponding electrode of the semiconductor chip, comprising the steps of:
   a) bonding an unbonded inner lead, of one of said arrays arranged along a side of the principal surface of the semiconductor chip located at a first corner of the one edge, to a corresponding electrode of the semiconductor chip;

b) bonding an unbonded inner lead of said one of said arrays located at a second corner of said one edge to a corresponding electrode of the semiconductor chip;

c) bonding a plurality of selected intermediate unbonded inner leads located next to the bonded inner lead at the first corner of said one edge, forming bonded inner leads;

d) bonding a plurality of selected intermediate unbonded inner leads located next to the bonded inner lead at the second corner of said one edge; and e) repeating said step c), progressing from inner leads at the first corner toward inner leads at a central portion of said one edge, and said step d), progressing from inner leads at the second corner toward inner leads immediately adjacent to said inner leads at said central portion of said one edge, until all of said number of inner leads are bonded to corresponding electrodes.

11. A single point bonding method claimed in claim 10 wherein a plurality of inner leads at the first corner are bonded to the respective corresponding electrodes, one at a time, in the order towards said inner lead located at said central portion of the same one edge.

12. A single point bonding method claimed in claim 11 wherein the number of inner leads at the first corner bonded to the respective corresponding electrodes is not larger than 25% of the total number of the inner leads arranged in the same one edge.

* * * * *